(12) United States Patent
Ando et al.

(10) Patent No.: US 11,735,628 B2
(45) Date of Patent: Aug. 22, 2023

(54) NANOSHEET METAL-OXIDE SEMICONDUCTOR FIELD EFFECT TRANSISTOR WITH ASYMMETRIC THRESHOLD VOLTAGE

(71) Applicant: International Business Machines Corporation, Armonk, NY (US)

(72) Inventors: Takashi Ando, Eastchester, NY (US); Ruilong Xie, Niskayuna, NY (US); Alexander Reznicek, Troy, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 17/188,426

(22) Filed: Mar. 1, 2021

(65) Prior Publication Data

US 2022/0278195 A1    Sep. 1, 2022

(51) Int. Cl.
| | | |
|---|---|---|
| *H01L 29/06* | (2006.01) | |
| *H01L 21/02* | (2006.01) | |
| *H01L 29/66* | (2006.01) | |
| *H01L 29/786* | (2006.01) | |

(Continued)

(52) U.S. Cl.
CPC ...... *H01L 29/0665* (2013.01); *H01L 21/0259* (2013.01); *H01L 29/66742* (2013.01); *H01L 29/786* (2013.01); *B82Y 10/00* (2013.01); *B82Y 40/00* (2013.01)

(58) Field of Classification Search
CPC ............. H01L 29/0665; H01L 21/0259; H01L 29/66742; H01L 29/786; H01L 29/0653; H01L 29/0673; H01L 29/401; H01L 29/42376; H01L 29/42392; H01L 29/66439; H01L 29/78696; H01L 29/775;

(Continued)

(56) References Cited

U.S. PATENT DOCUMENTS

| | | |
|---|---|---|
| 9,287,357 B2 | 3/2016 | Rodder |
| 9,812,449 B2 | 11/2017 | Obradovic |
| 9,985,141 B2 | 5/2018 | Lee |

(Continued)

OTHER PUBLICATIONS

Ando, et al., "Nanosheet Metal-Oxide Semiconductor Field Effect Transistor With Asymmetric Threshold Voltage", International Application No. PCT/CN2022/077293, International Filing Date Feb. 22, 2022, 33 pages.

(Continued)

*Primary Examiner* — Benjamin P Sandvik
*Assistant Examiner* — Cristian O Rivas
(74) *Attorney, Agent, or Firm* — Michael A. Petrocelli (57) ABSTRACT

A semiconductor structure, and a method of making the same, includes an inner spacer located between channel nanosheets on a semiconductor substrate, a first portion of the inner spacer located on a first side of the semiconductor structure and a second portion of the inner spacer located on a second side opposing the first side, the first portion of the inner spacer on the first side including a protruding region extending outwards from a middle top surface of the first portion of the inner spacer, and a metal gate stack in direct contact with the inner spacer, the first portion of the inner spacer including the protruding region pinching off the metal gate stack for increasing a threshold voltage on the first side.

15 Claims, 11 Drawing Sheets

(51) Int. Cl.
  *B82Y 40/00* (2011.01)
  *B82Y 10/00* (2011.01)

(58) Field of Classification Search
  CPC .......... H01L 21/02532; H01L 21/0262; B82Y 10/00; B82Y 40/00
  USPC ........................................................ 257/365
  See application file for complete search history.

(56) References Cited

U.S. PATENT DOCUMENTS

| | | |
|---|---|---|
| 10,008,583 B1 | 6/2018 | Rodder |
| 10,014,390 B1 | 7/2018 | Bouche |
| 10,026,652 B2 | 7/2018 | Wang |
| 10,332,961 B2 | 6/2019 | Cheng |
| 10,446,686 B2 | 10/2019 | Hook |
| 2005/0020086 A1 | 1/2005 | Kim |
| 2007/0252198 A1 | 11/2007 | Chung |
| 2017/0256611 A1* | 9/2017 | Kim ..................... H01L 29/775 |
| 2019/0058052 A1 | 2/2019 | Frougier |
| 2019/0157414 A1* | 5/2019 | Ando ................ H01L 21/02603 |
| 2021/0043727 A1 | 2/2021 | Frougier |

OTHER PUBLICATIONS

International Search Report and Written Opinion, International Application No. PCT/CN2022/077293, dated Apr. 27, 2022, 9 pages.

\* cited by examiner

NANOSHEET METAL-OXIDE SEMICONDUCTOR FIELD EFFECT TRANSISTOR WITH ASYMMETRIC THRESHOLD VOLTAGE

BACKGROUND

The present invention generally relates to the field of complementary metal-oxide semiconductor field effect transistor (MOSFET) devices, and more particularly to nanosheet MOSFETs having an asymmetric threshold voltage.

In contemporary semiconductor device fabrication processes a large number of semiconductor devices, such as field effect transistors (FETs), are fabricated on a single wafer. Non-planar device architectures, including nanosheet FETs, provide increased device density and increased performance over planar devices. In nanosheet FETs, in contrast to conventional FETs, the gate stack wraps around the full perimeter of each nanosheet, enabling fuller depletion in the channel region, and reducing short-channel effects. The wrap-around gate structures used in nanosheet devices can also enable greater management of leakage current in the active regions, even as drive current increases. However, the lateral asymmetric channel (LAC) doping profile used in planar FETs to improve electrical characteristics can be difficult to achieve in stacked nanosheet FETs.

SUMMARY

According to an embodiment of the present disclosure, a semiconductor structure includes an inner spacer located between channel nanosheets on a semiconductor substrate, a first portion of the inner spacer located on a first side of the semiconductor structure and a second portion of the inner spacer located on a second side opposing the first side, the first portion of the inner spacer on the first side including a protruding region extending outwards from a middle top surface of the first portion of the inner spacer, and a metal gate stack in direct contact with the inner spacer, the first portion of the inner spacer including the protruding region pinching off the metal gate stack for increasing a threshold voltage on the first side.

According to another embodiment of the present disclosure, a semiconductor structure includes a plurality of channel nanosheets above an isolation region on a semiconductor substrate, an inner spacer located between each of the plurality of channel nanosheets, a first portion of the inner spacer is located on a first side of the semiconductor structure and a second portion of the inner spacer is located on a second side opposing the first side, the first portion of the inner spacer on the first side includes a protruding region that extends outwards from a middle top surface of the first portion of the inner spacer. The semiconductor structure further includes a metal gate stack separated from a source region located on the first side and along sidewalls of the plurality of channel nanosheets by the first portion of the inner spacer, the metal gate stack is separated from a drain region located on the second side and along opposing sidewalls of the plurality of channel nanosheets by the second portion of the inner spacer, the protruding region of the first portion of the inner spacer pinching off the metal gate stack for increasing a threshold voltage on the first side.

According to yet another embodiment of the present disclosure, a method of forming a semiconductor structure includes forming a nanosheet stack on a semiconductor substrate, a dummy gate is located above the nanosheet stack adjacent to an offset spacer, the nanosheet stack includes an alternating sequence of sacrificial nanosheets and channel nanosheets, the sacrificial nanosheets including second nanosheets located between first nanosheets and third nanosheets, the first nanosheets and the third nanosheets having a first germanium concentration that is lower than a second germanium concentration of the second nanosheets, and selectively etching the sacrificial nanosheets. The lower first germanium concentration causes the first nanosheets and the third nanosheets being etched slower than the second nanosheets creating an indentation region on opposing sides of the nanosheet stack, the indentation region having a narrowing shape towards remaining second nanosheets of the sacrificial nanosheets.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

As integrated circuit fabrication continues to strive to produce smaller and denser integrated circuits, a viable alternative for 5 nm node technology and beyond includes nanosheet FETs. As previously described, the gate stack in nanosheet FETs wraps around the full perimeter of each nanosheet, enabling fuller depletion in the channel region, and reducing short-channel effects, among other benefits. This allows an increased device density and an increased performance over planar devices.

Nanosheet FETs often include thin alternating layers (nanosheets) of different semiconductor materials arranged in a stack. Typically, nanosheets are patterned into nanosheet fins. Once the nanosheet fins are patterned, a gate stack is formed over a channel region of the nanosheet fins, and source/drain regions are formed adjacent to the gate stack. In some devices, once the gate stack or the source/drain regions have been formed, an etching process is performed to selectively remove nanosheet layers of one of the dissimilar materials from the fins. The etching process results in the undercutting and suspension of the layers of the nanosheet fin to form nanosheets or nanowires that can be used to form gate-all-around devices.

In traditional MOSFETs manufacturing, a lateral asymmetric channel (LAC) doping profile approach is implemented to improve device's electrical characteristics. For LAC MOSFETs, the doping concentration at the source side of the channel region is higher than that of the drain side. Thus, the non-uniform channel doping causes the channel potential transition at the source side of the channel region being much steeper than that of the drain side while the device is operating. Such a steep potential distribution near the source side of the channel region enhances the lateral channel electric field, and thus increases carrier mobility. However, implementing a non-uniform channel doping profile in state-of-the-art short channel devices (e.g., nanosheets) can be very challenging due to the reduced device area. Thus, there is a need for alternative designs and techniques for introducing a halo region in a portion of the channel in a self-aligned manner in stacked nanosheet FETs.

Therefore, embodiments of the present disclosure provide a stacked nanosheet complementary metal oxide semiconductor (CMOS) structure in which an asymmetric threshold voltage distribution across the channel region is achieved by pinching off a work function metal near the source side of the channel region. The resulting asymmetric work function metal distribution improves device performance by increasing threshold voltage on the source side of the channel region without requiring metal gate patterning. One way to pinch-off the work function metal to achieve the asymmetric threshold voltage distribution across the channel includes forming asymmetric inner spacers. Embodiments by which the asymmetric inner spacers can be formed to achieve an stacked nanosheet structure with asymmetric threshold voltage distribution are described in detailed below by referring to the accompanying drawings in FIGS. 1-10B.

Figure 1:
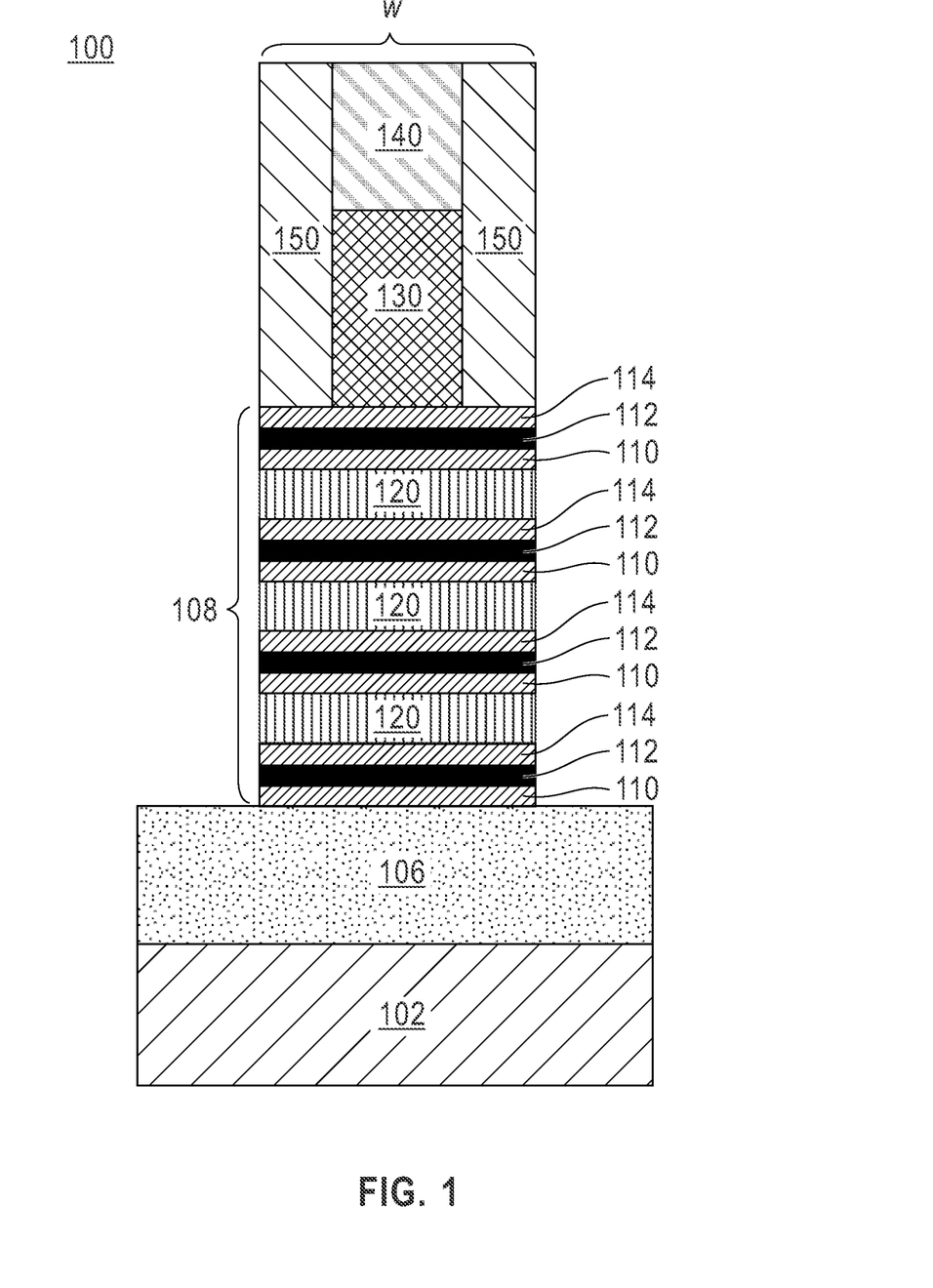
FIG. 1 is a cross-sectional view of a semiconductor structure depicting a nanosheet stack formed over a semiconductor substrate, according to an embodiment of the present disclosure.

Referring now to FIG. 1, a cross-sectional view of a semiconductor structure 100 including a nanosheet stack 108 is shown, according to an embodiment of the present disclosure. The nanosheet stack 108 is formed from an alternating sequence of silicon germanium (SiGe) sacrificial nanosheets 110, 112, 114 (hereinafter "sacrificial nanosheets") and silicon (Si) channel nanosheets 120 (hereinafter channel nanosheets"). The nanosheet stack 108 is formed on an oxide isolation layer 106, which is formed on a semiconductor substrate 102 (e.g., silicon). For ease of illustration, without intent of limitation, a sequence of fifteen alternating sacrificial nanosheets 110, 112, 114 and channel nanosheets 120 is shown in FIG. 1. However, any number of sacrificial nanosheets 110, 112, 114 and channel nanosheets 120 can be formed in the semiconductor structure 100 to satisfy design requirements.

In one or more embodiments, the alternating sequence of sacrificial nanosheets 110, 112, 114 and channel nanosheets 120 are formed by epitaxially growing one layer and then the next until the desired number and desired thicknesses of the nanosheets are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

According to an embodiment, (first or bottom) sacrificial nanosheets 110 and (third or top) sacrificial nanosheets 114 include silicon germanium (SiGe) with a first germanium (Ge) concentration of approximately 25% Ge, while (second or middle) sacrificial nanosheets 112 located between the sacrificial nanosheets 110 and the sacrificial nanosheets 114 are formed with a second germanium concentration of approximately 35% Ge. The different Ge concentrations allows to have different etch rates between sacrificial nanosheets 110, 114 and sacrificial nanosheets 112, as will be described in detail below.

According to an embodiment, known processing techniques have been applied to the alternating sequence of sacrificial nanosheets 110, 112, 114 and channel nanosheets 120 forming the nanosheet stack 108. For example, the known processing techniques can include the formation of fin hard masks (not shown) over the nanosheet stack 108. The fin hard masks can be formed by first depositing the hard mask material (for example silicon nitride) onto the nanosheet stack 108 using, for example, chemical vapor deposition (CVD), plasma enhanced CVD (PECVD) or any suitable technique for dielectric deposition. The deposited hard mask material is then patterned into a plurality of individual fin hard masks. The patterning of the hard masks is commensurate with a desired footprint and location of the channel nanosheets 120, which will be used to form the channel regions of the semiconductor device. According to an exemplary embodiment, reactive ion etching (RIE) is used to etch through the alternating sequence of sacrificial nanosheets 110, 112, 114 and channel nanosheets 120 to form the nanosheet stack 108 as illustrated in FIG. 1.

With continued reference to FIG. 1, a dummy gate 130 and a hard mask (HM) 140 are formed over and around the nanosheet stack 108. Specifically, as known by those skilled in the art, the dummy gate 130 is formed over a top and sidewalls (not shown) of the nanosheet stack 108. In one or more embodiments, the dummy gate 130 is formed from amorphous silicon (a-Si), and the hard mask 140 is formed from silicon nitride (SiN), silicon oxide, an oxide/nitride stack, or similar materials and configurations. The hard mask 140 is typically formed over the dummy gate 130 to act as an etch stop.

As depicted in the figure, offset spacers 150 have been formed along sidewalls of the dummy gate 130 and hard mask 140. Offset spacers 150 can be formed using a spacer pull down formation process. Offset spacers 150 can also be formed using a sidewall image transfer (SIT) spacer formation process, which includes spacer material deposition followed by directional RIE of the deposited spacer material. The width dimensions of the offset spacers 150 are chosen such that the offset spacers 150 and the hard mask 140 define an initial width (w).

As known by those skilled in the art, the offset spacers 150 are used as a mask, to recess portions of the sacrificial nanosheets 110, 112, 114 and the channel nanosheets 120 that are not under the offset spacers 150 and dummy gate 130, as illustrated in the figure. For example, a RIE process can be used to recess the portions of the sacrificial nanosheets 110, 112, 114 and the channel nanosheets 120 that are not under the offset spacers 150 and dummy gate 130. Although not depicted, typically the sacrificial nanosheets 110, 112, 114 and the channel nanosheets 120 are recessed into the oxide isolation layer 106 forming a trench (not shown). Because the fin etch is being performed before the dummy gate replacement steps (described in detail below), the semiconductor device fabrication processes described herein can be referred to as a fin first process.

Figure 2:
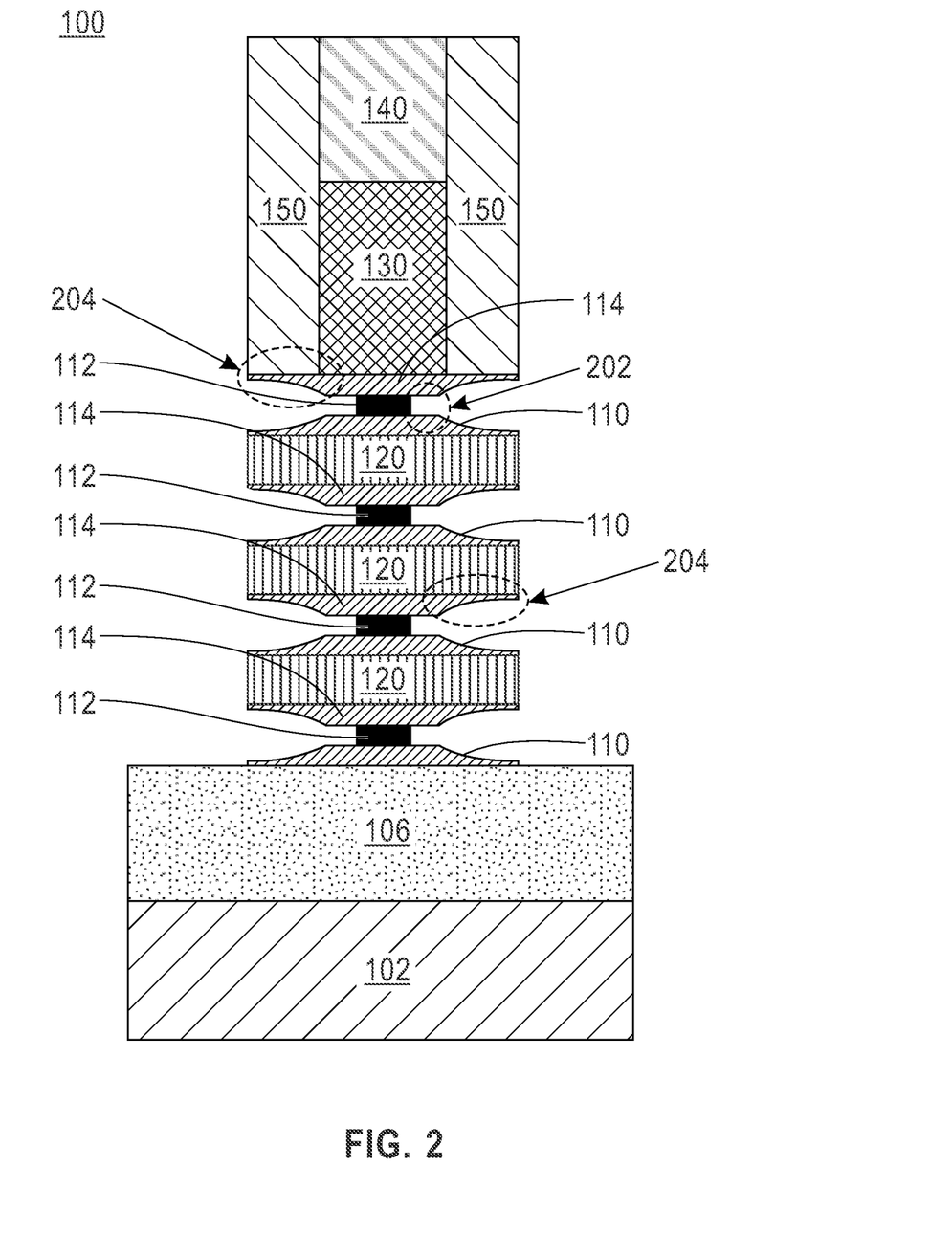
FIG. 2 is a cross-sectional view of the semiconductor structure after recessing sacrificial nanosheets, according to an embodiment of the present disclosure.

Referring now to FIG. 2, a cross-sectional view of the semiconductor structure 100 after recessing sacrificial nanosheets 110, 112, 114 is shown, according to an embodiment of the present disclosure. In this embodiment, an isotropic etch process such as, for example, a hydrogen chloride (HCL) gas isotropic etch can be performed on the semiconductor structure 100 to recess sacrificial nanosheets 110, 112, 114. Preferably, the selected isotropic etch process is capable of etching silicon germanium without attacking silicon.

As mentioned above, the germanium concentration in the sacrificial nanosheets 110, 114 is less than the germanium concentration in the sacrificial nanosheets 112. Thus, during the etching process the sacrificial nanosheets 112 formed with higher germanium concentration are etched faster than the sacrificial nanosheets 110, 114 formed with lower germanium concentration. This causes a deeper recess or indentation region 202 into the sacrificial nanosheets 112, as depicted in the figure. Stated differently, because of the lower germanium concentration of the sacrificial nanosheets 110, 114, these layers are etched slower than the sacrificial nanosheets 112 creating the indentation region 202. It should be noted that regions 204 containing remaining portions of silicon germanium from the sacrificial nanosheets 110, 114 can still be present in the semiconductor structure 100 after the etching process. The etch rate difference between the sacrificial nanosheets 110, 114 and the sacrificial nanosheets 112 naturally causes the indentation region 202 to have a narrowing shape towards the sacrificial nanosheets 112, as illustrated in the figure.

Figure 3:
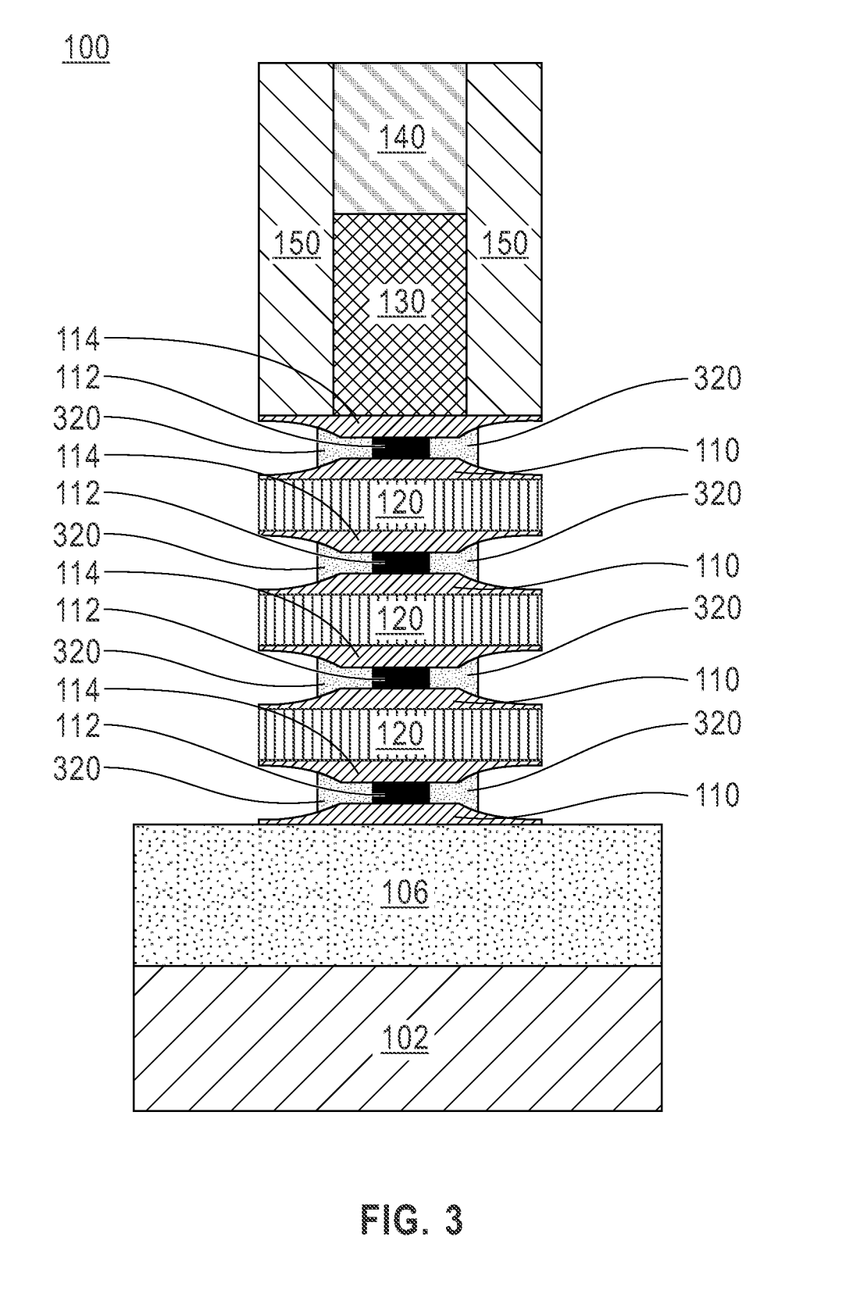
FIG. 3 is a cross-sectional view of the semiconductor structure after forming a first inner spacer, according to an embodiment of the present disclosure.

Referring now to FIG. 3, a cross-sectional view of the semiconductor structure 100 after forming a first inner spacer 320 is shown, according to an embodiment of the present disclosure. In this embodiment, the first inner spacer 320 can be formed, for example, by conformal deposition of an inner spacer material that pinches off the indentation region 202 (FIG. 2). The inner spacer material forming the first inner spacer 320 includes, for example, silicon dioxide ($SiO_2$).

An isotropic etching, such as wet etching, is then performed to recess the first inner spacer 320, as depicted in the figure. Recessing of the first inner spacer 320 exposes remaining portions of the sacrificial nanosheets 110, 114 (e.g., regions 204 in FIG. 2) located below the offset spacers 150 and on the channel nanosheets 120. It should be noted that excessive inner spacer material from other regions of the semiconductor structure 100 can be removed during the isotropic etching process.

Figure 4:
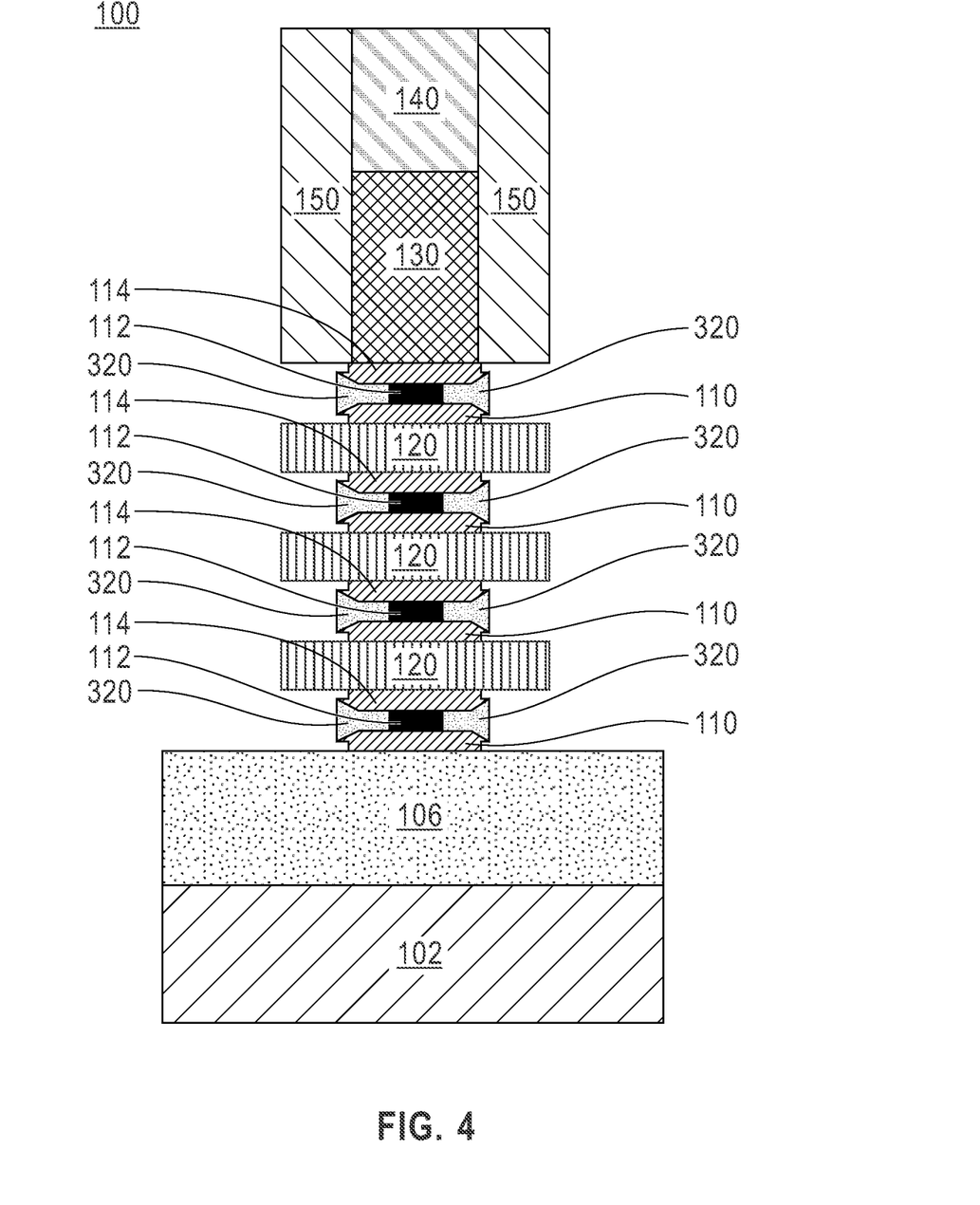
FIG. 4 is a cross-sectional view of the semiconductor structure after removing residual portions of the sacrificial nanosheets, according to an embodiment of the present disclosure.

Referring now to FIG. 4, a cross-sectional view of the semiconductor structure 100 is shown after removing residual portions of the sacrificial nanosheets 110, 114 below the offset spacers 150 and on the channel nanosheets 120 exposed after recessing the first inner spacer 320, according to an embodiment of the present disclosure.

As depicted in the figure, exposed remaining portions of the sacrificial nanosheets 110, 114 located below the offset spacers 150 and on the channel nanosheets 120 are selectively removed from the semiconductor structure 100 (i.e., from exposed areas of regions 204 in FIG. 2) to prevent SiGe release damage to subsequently formed source/drain epi regions. In an exemplary embodiment, an isotropic etch process such as, for example, a hydrogen chloride (HCL) gas isotropic etch can be conducted to remove exposed residual portions of the sacrificial nanosheets 110, 114 below the offset spacers 150 and on the channel nanosheets 120. Portions of the sacrificial nanosheets 110, 114 may remain in contact with the dummy gate 130, inner regions of the channel nanosheets 120 and oxide isolation layer 106, as depicted in the figure.

Figure 5:
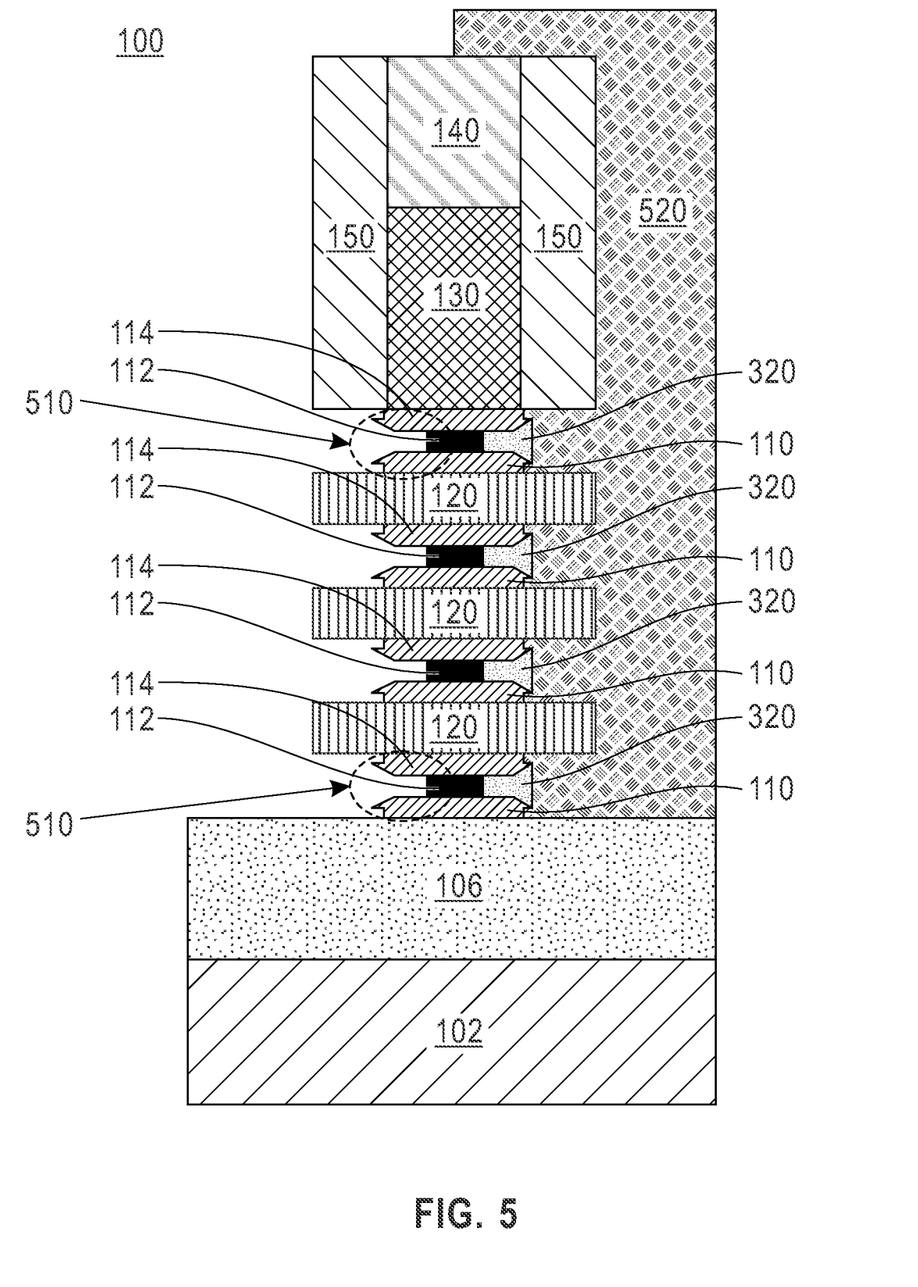
FIG. 5 is a cross-sectional view of the semiconductor structure after forming a protective organic planarization layer and removing portions of the first inner spacer, according to an embodiment of the present disclosure.

Referring now to FIG. 5, a cross-sectional view of the semiconductor structure 100 is shown after forming a protective organic planarization layer (OPL) 520 and removing portions of the first inner spacer 320 from a first side of the semiconductor structure 100 opposing the protective OPL 520, according to an embodiment of the present disclosure.

The protective OPL 520 is formed by depositing an organic planarizing material that is capable of effectively preventing damage of underlying layers during subsequent etching processes. According to an embodiment, protective OPL 520 protects a second side of the semiconductor structure 100 opposing the first side during an etching process used to remove the first inner spacer 320 from the first side of the semiconductor structure 100, as depicted in the figure. As will be explained below, a source drain region is formed on the first side of the semiconductor structure 100, while a drain region is formed on the opposing second side of the semiconductor structure 100.

The protective OPL 520 can include, but is not necessarily limited to, an organic polymer including C, H, and N. According to an embodiment, the OPL material can be free of silicon (Si). According to another embodiment, the OPL material can be free of Si and fluorine (F). As defined herein, a material is free of an atomic element when the level of the atomic element in the material is at or below a trace level detectable with analytic methods available in the art. Non-limiting examples of the OPL material forming the protective OPL 520 can include JSR HM8006, JSR HM8014, AZ UM10M2, Shin Etsu ODL 102, or other similar commercially available materials. The protective OPL 520 may be deposited by, for example, spin coating followed by a planarization process, such as chemical mechanical polishing (CMP).

After forming the protective OPL 520, portions of the first inner spacer 320 are selectively removed using, for example, a wet etching process, such as diluted HF. Removing portions of the first inner spacer 320 from the first side of the semiconductor structure 100 creates first recesses 510. After removing the portions of the first inner spacer 320 from the first side of the semiconductor structure 100, the protective OPL 520 is removed, as depicted in FIG. 6.

Figure 6:
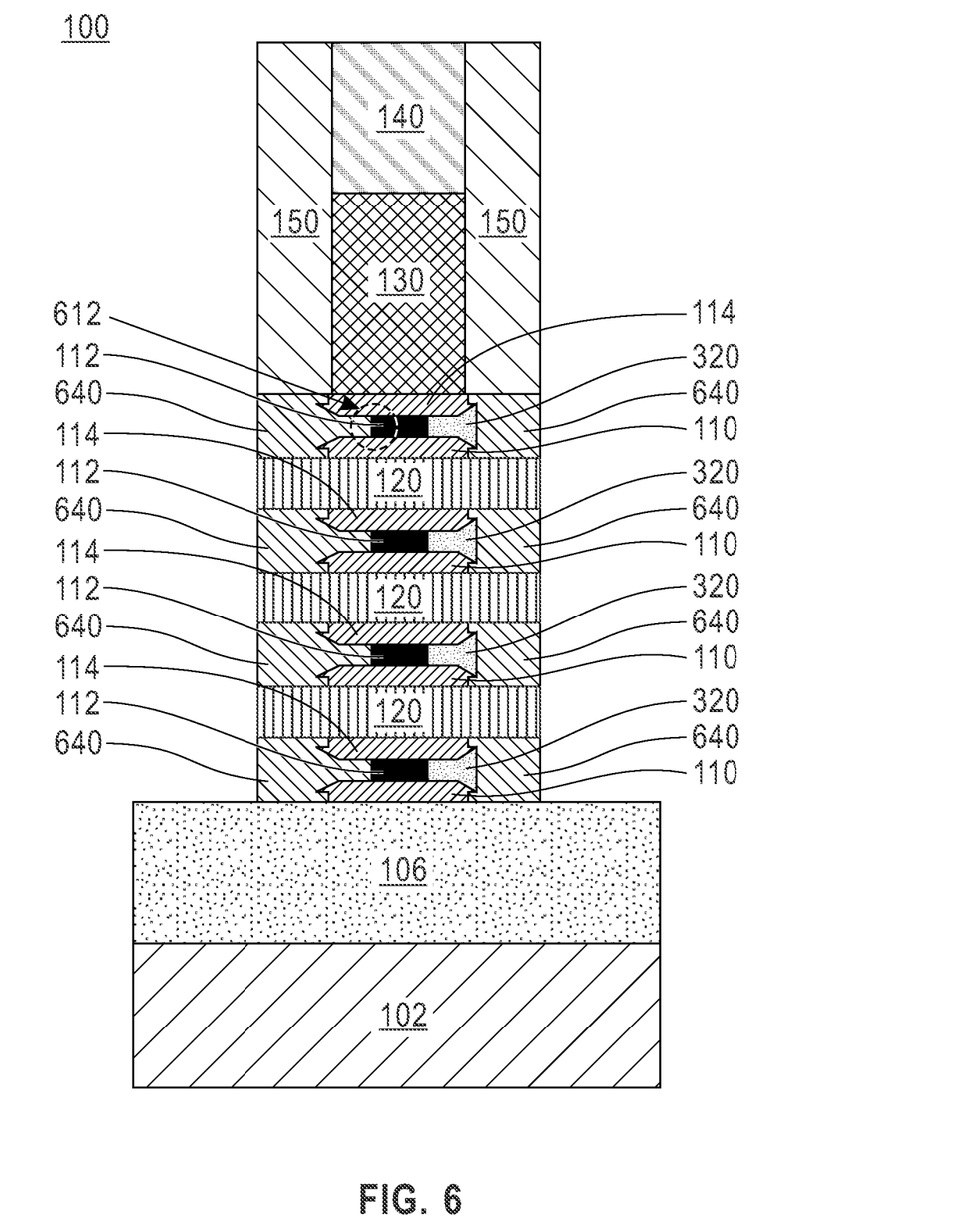
FIG. 6 is a cross-sectional view of the semiconductor structure after removing the protective organic planarization layer and forming a second inner spacer, according to an embodiment of the present disclosure.

Referring now to FIG. 6, a cross-sectional view of the semiconductor structure 100 after removing the protective OPL 520 and forming a second inner spacer 640 is shown, according to an embodiment of the present disclosure. In an embodiment, the protective OPL 520 can be removed using, for example, an OPL RIE including a trace point detection.

Similar to the first inner spacer 320, the second inner spacer 640 can be formed by conformal deposition of an inner spacer material. According to an embodiment, the inner spacer material forming the second inner spacer 640 includes, for example, SiN, SiC, SiOC, SiCN, BN, SiBN, SiBCN, SiOCN, $SiO_xN_y$, and combinations thereof. Etching processes including RIE, wet etch, or isotropic vapor phased dry etch can be conducted to remove excess inner spacer material from the semiconductor structure 100.

It should be noted that the second inner spacer 640 constitutes the main inner spacer for the semiconductor structure 100. In one or more embodiments, the spacer material forming the first inner spacer 320 is selected based on providing etch selectivity to the spacer material forming the second inner spacer 640. As depicted in the figure, the second inner spacer 640 on the first side of the semiconductor structure 100 substantially fills the first recesses 510 (FIG. 5) which corresponds to the indention region 202 shown in FIG. 2.

As shown in the figure, second inner spacer 640 includes a protruding region 612 extending outwards from a middle top surface of the inner spacer 640 towards the remaining sacrificial nanosheets 112. The protruding region 612 provides a T-shaped inner spacer formed in a way such that a space between the protruding region 612 and the channel nanosheets 120 is less than twice a thickness of a subsequently formed nitride layer (e.g., inner nitride layer 1010 shown in FIG. 10A). The resulting asymmetric shape of the second inner spacer 640 can pinch off the subsequently formed nitride layer on the first or source side of the semiconductor structure 100, as will be described in detail below.

In an exemplary embodiment, a thickness of the second inner spacer 640 can vary between approximately 5 nm to approximately 10 nm, and ranges there between, although a thickness less than 5 nm and greater than 10 nm may be acceptable. A thickness of the protruding region 612 of the second inner spacer 640 can vary between approximately 2 nm to approximately 5 nm, although a thickness less than 2 nm and greater than 5 nm may be acceptable.

Figure 7:
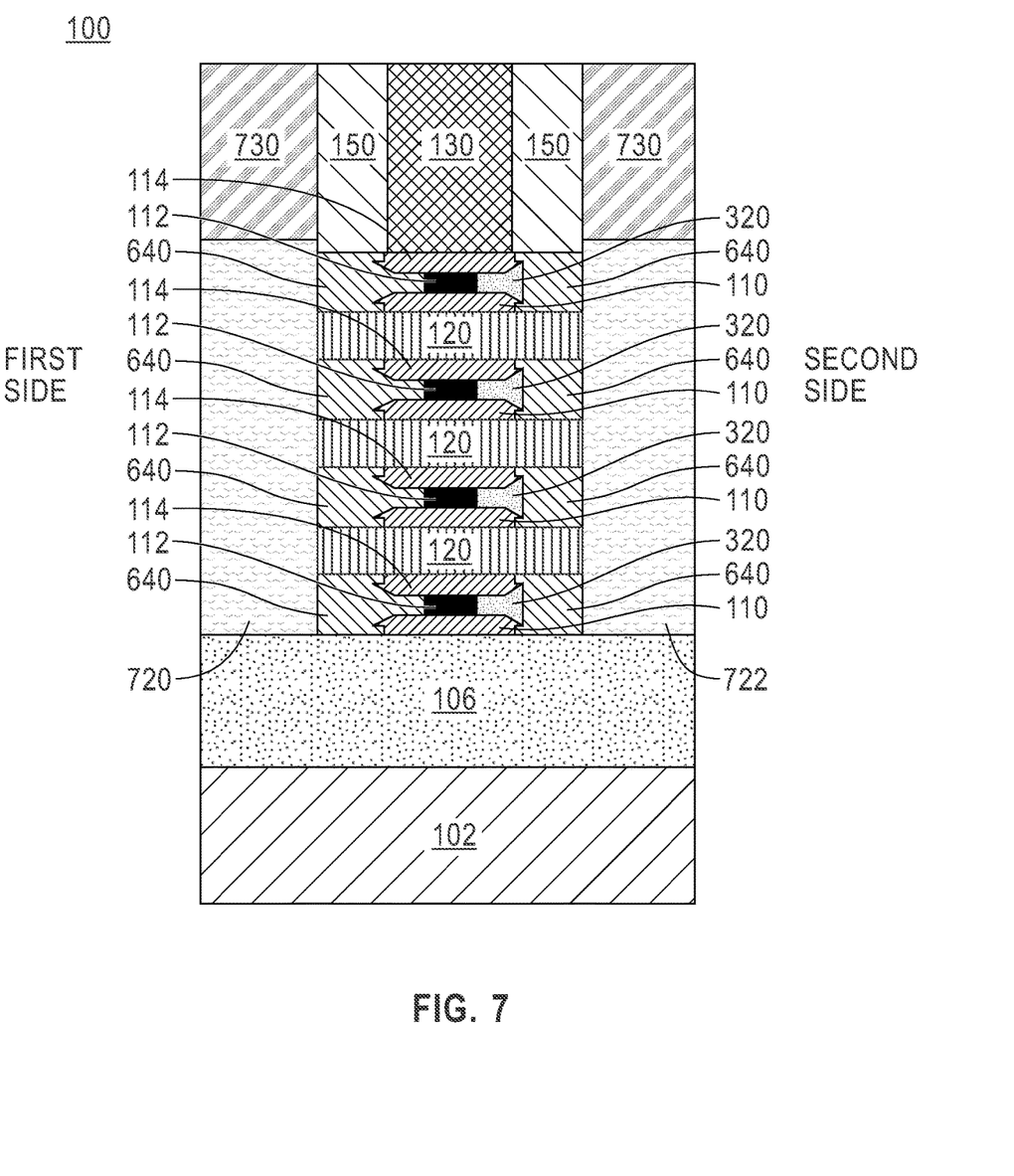
FIG. 7 is a cross-sectional view of the semiconductor structure after forming a source region and drain region, according to an embodiment of the present disclosure.

Referring now to FIG. 7, a cross-sectional view of the semiconductor structure 100 after forming source region 720 and drain region 722 is shown, according to an embodiment of the present disclosure.

At this step of the manufacturing process, source region 720 and drain region 722 are formed using an epitaxial layer growth process on the exposed ends of the channel nanosheets 120. In-situ doping (ISD) or ex-situ doping can be applied to dope the source region 720 and drain region 722, thereby creating the necessary junctions of the semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

It may be understood that the first side of the semiconductor structure 100 corresponds to the side in which the source region 720 is located (i.e., source side). Similarly, the second side of the semiconductor structure 100 (opposing the first side) corresponds to the side in which the drain region 722 is located (i.e., drain side).

After forming the source region 720 and the drain region 722, an interlevel dielectric (ILD) layer 730 is formed to fill voids between gate structures and other existing devices within the semiconductor structure 100. The ILD layer 730 can be formed by, for example, CVD of a dielectric material. Non-limiting examples of dielectric materials to form the ILD layer 730 may include silicon oxide, silicon nitride, hydrogenated silicon carbon oxide, silicon based low-k dielectrics, flowable oxides, porous dielectrics, or organic dielectrics including porous organic dielectrics. After deposition of the ILD layer 730, a CMP process is conducted on the semiconductor structure 100 to expose a top surface of the dummy gate 130, as depicted in the figure.

Figure 8:
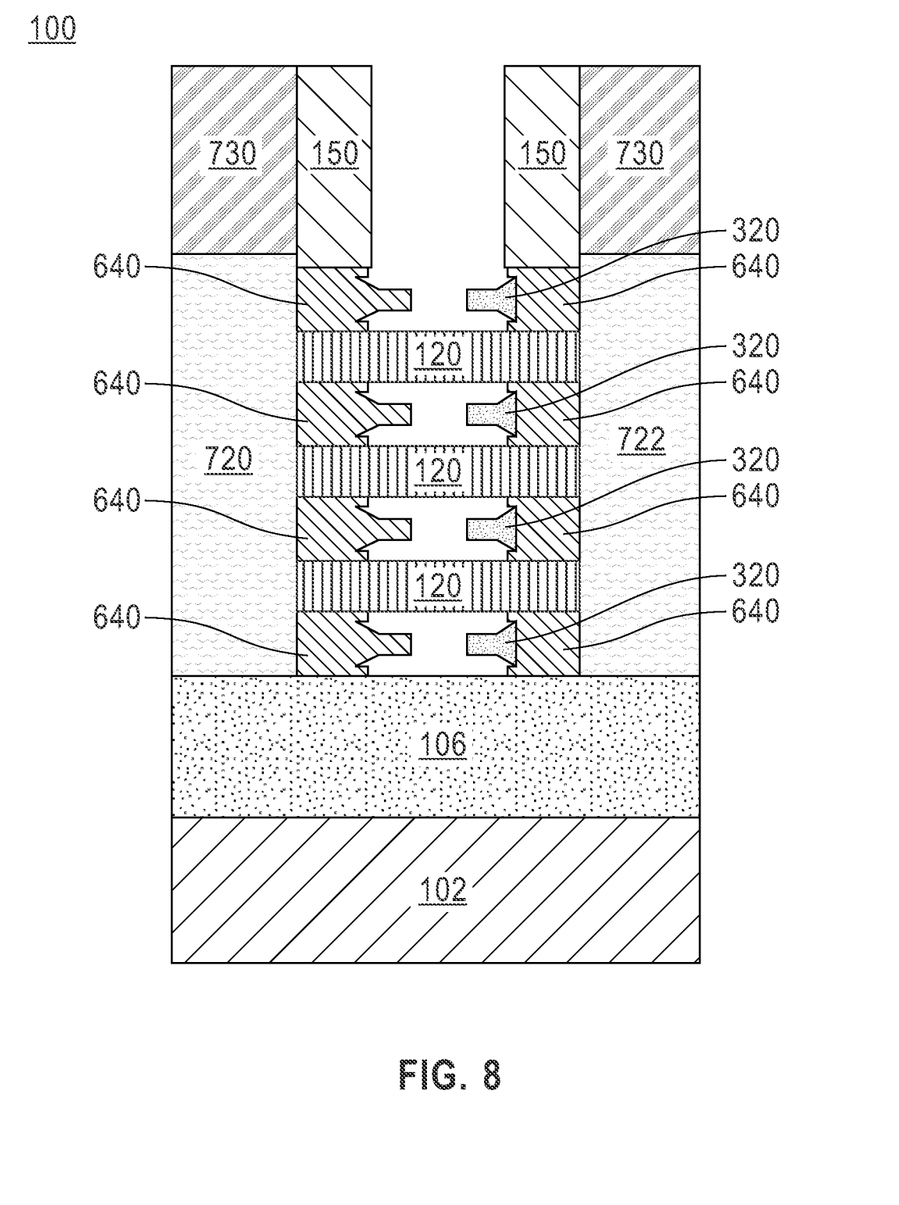
FIG. 8 is a cross-sectional view of the semiconductor structure after removing a dummy gate and the sacrificial nanosheets, according to an embodiment of the present disclosure.

Referring now to FIG. 8, a cross-sectional view of the semiconductor structure 100 is shown after removing the dummy gate 130 and the sacrificial nanosheets 110, 114, according to an embodiment of the present disclosure.

The dummy gate 130 and the (SiGe) sacrificial nanosheets 110, 114 can be removed by known etching processes including, for example, RIE or chemical oxide removal (COR). In a gate-last fabrication process, the removed dummy gate 130 is thereafter replaced with a metal gate (not shown) as known in the art. It should be noted that the dummy gate 130 and sacrificial nanosheets 110, 114 are removed selectively to the first inner spacer 320 remaining on the second side of the semiconductor structure 100.

Figure 9:
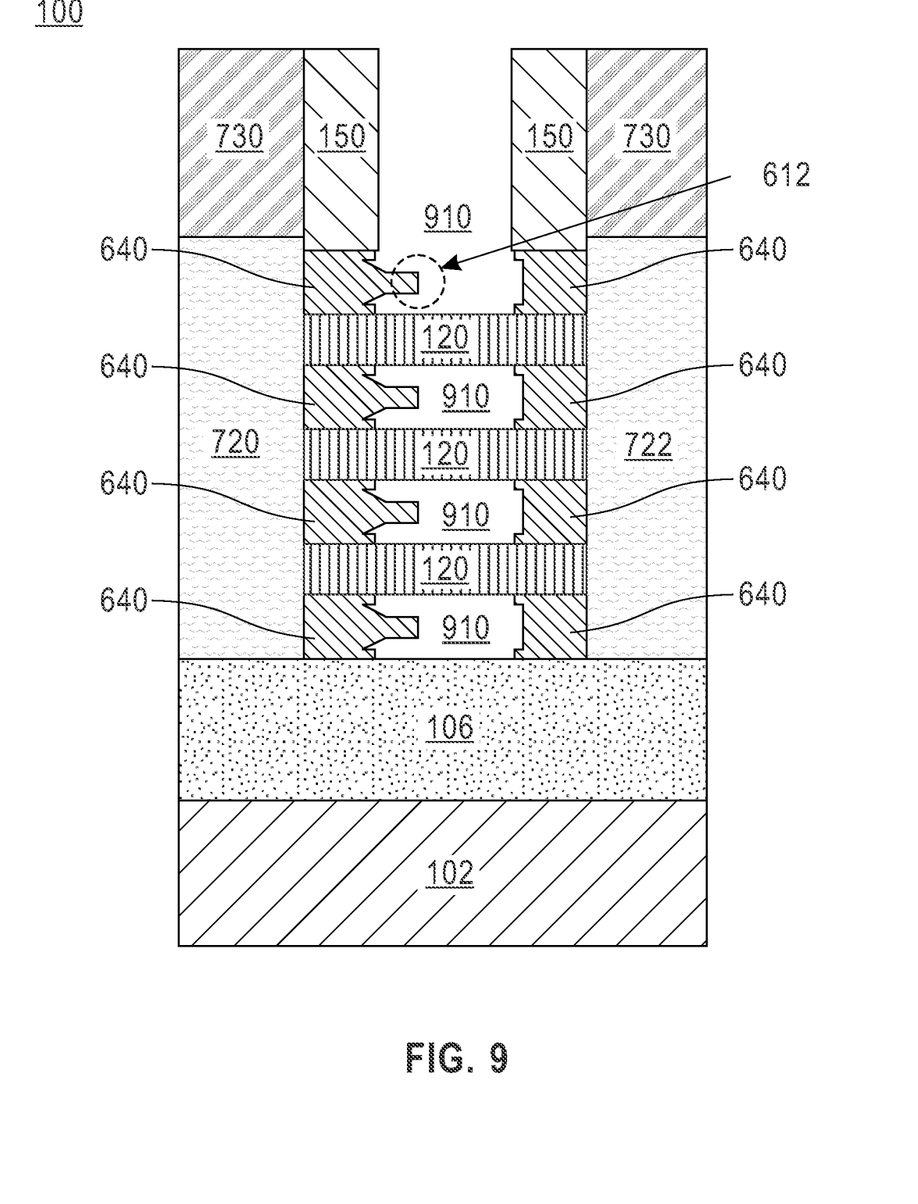
FIG. 9 is a cross-sectional view of the semiconductor structure after removing remaining portions of the first inner spacer, according to an embodiment of the present disclosure.

Referring now to FIG. 9, a cross-sectional view of the semiconductor structure 100 after removing remaining portions of the first inner spacer 320 is shown, according to an embodiment of the present disclosure. In this embodiment, known etching processes such as, for example, RIE or wet etching can be used to remove the remaining portions of the first inner spacer 320 from the second or drain side of the semiconductor structure 100. Second recesses 910 are formed in the semiconductor structure 100 after removing the dummy gate 130 (FIG. 7), sacrificial nanosheets 110, 114 (FIG. 7), and first inner spacer 320 (FIG. 8).

After removing the remaining portions of the first inner spacer 320 (FIG. 8) from the drain side of the semiconductor structure 100, the asymmetric configuration of the second inner spacer 640 can be visibly appreciated in the semiconductor structure 100. As shown in the figure, the second inner spacer 640 on the first (source) side of the semiconductor structure 100 includes the protruding region 612 that extends towards the second recesses 910, while the second inner spacer 640 on the second (drain) side of the semiconductor structure 100 does not have the protruding region 612. As mentioned above, the protruding region 612 on the source side of the semiconductor structure 100 provides a T-shaped inner spacer configuration capable of pinching-off a subsequently formed nitride layer, as will be described in detail below.

Figure 10A:
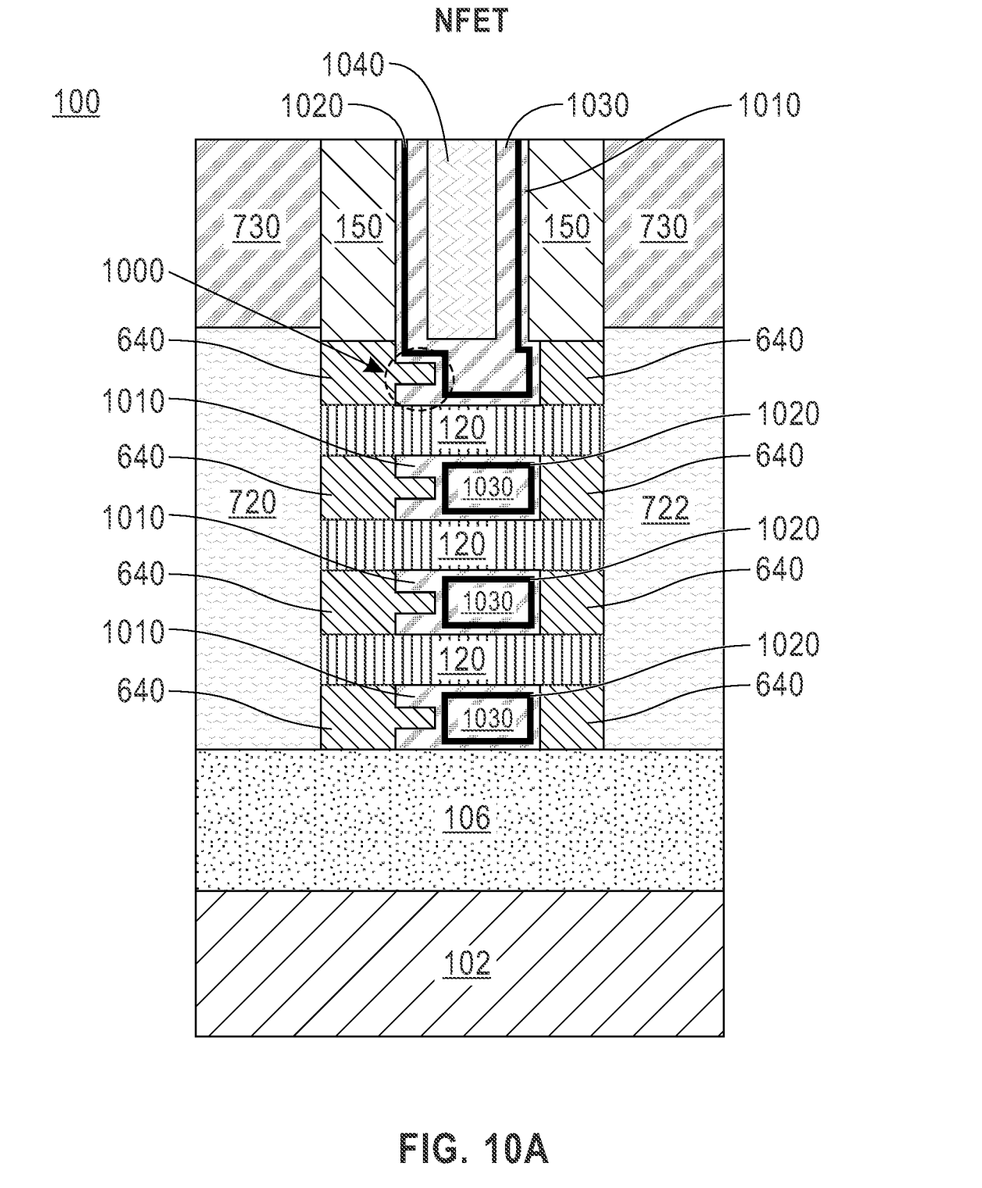
FIGS. 10A-10B depict cross-sectional views of the semiconductor structure after depositing a gate stack and a metal fill, according to an embodiment of the present disclosure.
Figure 10B:
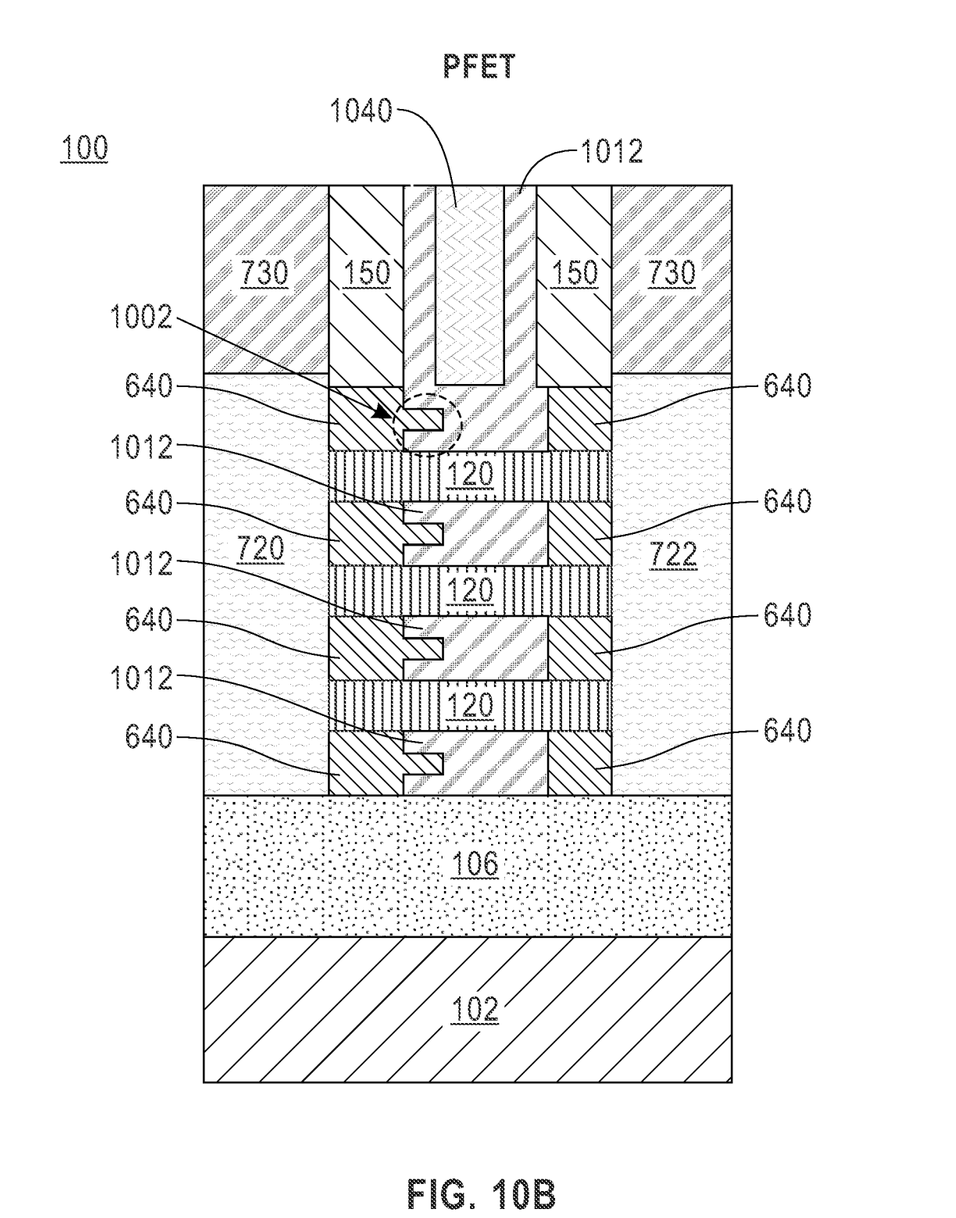

Referring now to FIGS. 10A-10B, a cross-sectional view of the semiconductor structure 100 after deposition of a gate stack and metal fill is shown, according to an embodiment of the present disclosure. As known by those skilled in the art, in a replacement metal gate or gate-last fabrication process, the dummy gate 130 (FIG. 7) is replaced with corresponding n-type or p-type metal gate stacks.

According to an embodiment, FIG. 10A depicts the semiconductor structure 100 after deposition of gate dielectrics and work function metals suitable for an n-type field effect transistor (NFET) device. For ease of illustration gate dielectrics are not depicted in the figure. In this embodiment, a tri-layer gate metal stack formed by a doped transition metal layer 1020 located between an inner nitride layer 1010 and an outer nitride layer 1030 are conformally deposited in succession within second recesses 910 (FIG. 9).

The inner nitride layer 1010 can be conformally formed within second recess 910 (FIG. 9) using any suitable deposition process. In some embodiments, the inner nitride layer 1010 is conformally deposited using ALD. In some embodiments, the inner nitride layer 1010 includes titanium nitride (TiN). A thickness of the inner nitride layer 1010 can vary between approximately 1 nm to approximately 2 nm.

The doped transition metal layer 1020 is formed on the inner nitride layer 1010. In some embodiments, the doped transition metal layer 1020 is deposited using ALD. In some embodiments, the doped transition metal layer 1020 includes an aluminum doped transition metal carbide. In some embodiments, the doped transition metal layer 1020 is formed using a hybrid ALD/CVD process having alternating pulses of a transition metal containing precursor and an aluminum carbide containing precursor. In this embodiment, the doped transition metal layer 1020 is made of, for example, aluminum doped titanium carbide (TiAlC). A thickness of the doped transition metal layer 1020 can vary between approximately 3 nm to approximately 5 nm.

As known by those skilled in the art, the presence of aluminum (Al) containing metals can lower the device threshold voltage. By forming a T-shaped second inner spacer 640, the inner nitride layer 1010 is pinched-off on the source side of the semiconductor structure 100 thereby preventing the deposition of Al-containing metals from the doped transition metal layer 1020. Accordingly, the inner spacer-gate metal stack configuration shown in FIG. 10A provides a lateral asymmetric channel (LAC) structure with an asymmetric work function metal distribution that causes threshold voltage to be higher on the first or source side of the semiconductor structure 100. This may improve device short channel performance without additional metal patterning.

The outer nitride layer 1030 can be conformally formed on the doped transition metal layer 1020 in a similar manner as the inner nitride layer 1010. In some embodiments, the outer nitride layer 1030 is conformally deposited using ALD. In some embodiments, the outer nitride layer 1030 includes titanium nitride (TiN). A thickness of the outer nitride layer 1030 can vary between approximately 1 nm to approximately 2 nm.

In some embodiments, a gate dielectric (not shown) is formed between channel nanosheets 120 and the inner nitride layer 1010. The gate dielectric can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the gate dielectric can have a thickness varying from approximately 1 nm to approximately 3 nm.

According to another embodiment, FIG. 10B depicts the semiconductor structure 100 after deposition of work function metals suitable for a p-type field effect transistor (PFET) device. In this embodiment, a nitride layer 1012 is conformally deposited within second recesses 910 (FIG. 9). The nitride layer 1012 can be conformally formed within recess 910 (FIG. 9) using any suitable deposition process. In some embodiments, the nitride layer 1012 is conformally deposited using ALD. In some embodiments, the nitride layer 1012 includes titanium nitride (TiN). A thickness of the nitride layer 1012 can vary between approximately 3 nm to approximately 5 nm. As mentioned above with reference to FIG. 10A, a gate dielectric (not shown) can be formed between the channel nanosheets 120 and the nitride layer 1012.

In embodiments in which the semiconductor structure 100 is a PFET device, no aluminum (Al) containing metals are included in the gate metal stack. Thus, in these embodiments, the asymmetric threshold voltage profile is caused by the difference in effective metal thickness between the source side and the drain side of the semiconductor structure 100. Stated differently, an effective thickness of the (metal) nitride layer 1012 on the source side of the semiconductor structure 100 is less than an effective thickness of the nitride layer 1012 on the drain side of the semiconductor structure 100. This reduction in effective metal thickness on the source side of the semiconductor structure 100 is caused by the protruding region 612 of the second inner spacer 640.

Accordingly, a lateral asymmetric channel (LAC) structure with asymmetric work function metal distribution and higher threshold voltage on the (first) source side can be achieved in embodiments in which the semiconductor structure 100 is a PFET device. Similarly to the NFET device described in FIG. 10A above, device short channel performance can be improved without additional metal patterning.

With continued reference to FIGS. 10A-10B together, as known by those skilled in the art, after depositing the corresponding (p-type or n-type) work function metals within the second recesses 910 (FIG. 9) a conductive gate layer 1040 is deposited in the semiconductor structure 100 above the uppermost nitride layer, as shown in the figure. The conductive gate layer 1040 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, or any suitable combination of these materials. In various embodiments, the conductive gate layer 1040 may further include dopants that are incorporated during or after deposition. Any known deposition process can be used to formed the conductive gate layer 1040. A planarization process, such as CMP, is generally conducted on the semiconductor structure 100 after deposition of the conductive gate layer 1040.

Finally, the proposed embodiments allow the formation of a semiconductor structure with an asymmetric threshold voltage profile between source and drain regions that may improve device performance and enable further scaling of nanosheet technology.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
an inner spacer located between channel nanosheets on a semiconductor substrate, a first portion of the inner spacer located on a first side of the semiconductor structure and a second portion of the inner spacer located on a second side opposing the first side, the first portion of the inner spacer on the first side including a protruding region extending outwards from a middle top surface of the first portion of the inner spacer; and
a metal gate stack in direct contact with the inner spacer, the first portion of the inner spacer including the protruding region pinching off the metal gate stack for increasing a threshold voltage on the first side, the protruding region providing a T-shaped inner spacer with a space between the protruding region and the channel nanosheets being less than twice a thickness of an inner nitride layer in the metal gate stack.

2. The semiconductor structure of claim 1, further comprising:
a source region located on the first side and along sidewalls of the channel nanosheets separated from the metal gate stack by the first portion of the inner spacer; and
a drain region located on the second side and along opposing sidewalls of the channel nanosheets separated from the metal gate stack by the second portion of the inner spacer on the second side.

3. The semiconductor structure of claim 1, further comprising a metal gate above the metal gate stack adjacent to an offset spacer.

4. The semiconductor structure of claim 1, wherein the semiconductor structure comprises an NFET device and the metal gate stack comprises a tri-layer gate metal stack formed by a doped transition metal layer located between the inner nitride layer and an outer nitride layer, the doped transition layer comprising an aluminum doped transition metal carbide.

5. The semiconductor structure of claim 4, wherein the protruding region pinches off the inner nitride layer preventing deposition of the doped transition metal layer on the first side for increasing the threshold voltage.

6. The semiconductor structure of claim 1, wherein the semiconductor structure comprises a PFET device and the metal gate stack comprises the inner nitride layer.

7. The semiconductor structure of claim 6, wherein the protruding region pinches off the inner nitride layer decreasing an effective metal thickness of the inner nitride layer on the first side for increasing threshold voltage.

8. The semiconductor structure of claim 1, wherein the channel nanosheets comprise silicon and the inner spacer comprises at least one of SiN, SiC, SiOC, SiCN, BN, SiBN, SiBCN, SiOCN, and SiOxNy.

9. A semiconductor structure comprising:
   a plurality of channel nanosheets above an isolation region on a semiconductor substrate;
   an inner spacer between each of the plurality of channel nanosheets, a first portion of the inner spacer located on a first side of the semiconductor structure, and a second portion of the inner spacer located on a second side opposing the first side, the first portion of the inner spacer on the first side comprising a protruding region extending outwards from a middle top surface of the first portion of the inner spacer; and
   a metal gate stack separated from a source region located on the first side and along sidewalls of the plurality of channel nanosheets by the first portion of the inner spacer, the metal gate stack being separated from a drain region located on the second side and along opposing sidewalls of the plurality of channel nanosheets by the second portion of the inner spacer, the protruding region of the first portion of the inner spacer pinching off the metal gate stack for increasing a threshold voltage on the first side, the protruding region providing a T-shaped inner spacer with a space between the protruding region and the channel nanosheets being less than twice a thickness of an inner nitride layer in the metal gate stack.

10. The semiconductor structure of claim 9, further comprising a metal gate above the metal gate stack adjacent to an offset spacer.

11. The semiconductor structure of claim 9, wherein the semiconductor structure comprises an NFET device and the metal gate stack comprises a tri-layer gate metal stack formed by a doped transition metal layer located between the inner nitride layer and an outer nitride layer, the doped transition layer comprising an aluminum doped transition metal carbide.

12. The semiconductor structure of claim 11, wherein the protruding region pinches off the inner nitride layer preventing deposition of the doped transition metal layer on the first side for increasing the threshold voltage.

13. The semiconductor structure of claim 9, wherein the semiconductor structure comprises a PFET device and the metal gate stack comprises the inner nitride layer.

14. The semiconductor structure of claim 13, wherein the protruding region pinches off the inner nitride layer decreasing an effective metal thickness of the inner nitride layer on the first side for increasing the threshold voltage.

15. The semiconductor structure of claim 9, wherein the plurality of channel nanosheets comprise silicon and the inner spacer comprises at least one of SiN, SiC, SiOC, SiCN, BN, SiBN, SiBCN, SiOCN, and SiOxNy.

* * * * *